United States Patent [19]

Hamaguchi

[11] Patent Number: 4,578,304
[45] Date of Patent: Mar. 25, 1986

[54] MULTILAYER WIRING SUBSTRATE

[75] Inventor: Hiroyuki Hamaguchi, Tokyo, Japan

[73] Assignee: NEC Corporation, Tokyo, Japan

[21] Appl. No.: 678,828

[22] Filed: Dec. 6, 1984

[30] Foreign Application Priority Data

Dec. 28, 1983 [JP] Japan .................. 58-249488

[51] Int. Cl.[4] .............. B32B 15/00; B32B 3/00; C25D 5/10; C25D 5/28
[52] U.S. Cl. ..................... 428/209; 428/901; 428/660; 428/666; 428/671; 428/670; 156/297
[58] Field of Search ............... 428/901, 209, 660, 666, 428/671, 670, 210; 156/297; 174/68 R, 68.5

[56] References Cited

U.S. PATENT DOCUMENTS

| 3,381,256 | 4/1968 | Schuller et al. | 428/670 X |
| 4,016,050 | 4/1977 | Lesh et al. | 428/660 X |
| 4,190,474 | 2/1980 | Berdan et al. | 428/901 X |
| 4,260,449 | 4/1981 | Berdan et al. | 428/901 X |
| 4,311,768 | 1/1982 | Berdan et al. | 428/901 X |

OTHER PUBLICATIONS

Fraser et al., IBM Tech Discl. 3020, vol. 15, No. 10, 3/73.
"A Comparison of Thin Film, Thick Film, and Co-Fired High Density Ceramic Multilayer with the Combined Technology: T&T HDCM (Thin Film and Thick Film High Density Ceramic Module)", Dr. M. Terasawa et al., The International Journal for Hybrid Microelectronics, vol. 6, No. 1, Oct. 1983, pp. 607–615.

Primary Examiner—George F. Lesmes
Assistant Examiner—Nancy A. B. Swisher
Attorney, Agent, or Firm—Burns, Doane, Swecker & Mathis

[57] ABSTRACT

A multilayer wiring substrate composed of organic dielectric layers with wiring layers disposed therein supports large-scale integrated circuit chips and bonding pads. To prevent damage to the wiring layers when wires from the integrated circuit chips are attached to the bonding pads by thermocompression bonding, a metallic layer is interposed between the wiring layers and the bonding pads.

7 Claims, 2 Drawing Figures

MULTILAYER WIRING SUBSTRATE

BACKGROUND OF THE INVENTION

The present invention relates to a multilayer wiring substrate suitable for mounting a plurality of electronic circuit elements by a thermocompression bonding technique.

A conventional multilayer wiring substrate using organic materials as dielectric materials which are feasible for finer and denser wiring and smaller capacitance between signal lines has been proposed by Dr. M. Terasawa et al in a paper entitled "A Comparison of Thin Film, Thick Film, and Co-Fired High Density Ceramic Multilayer with The Combined Technology: T&T HDCM", The International Journal for Hybrid Microelectronics, Vol. 6, No. 1 (October 1983), pp. 607-615. The hardness of such organic materials (about 70 to 150 Vickers) is far lower than that of inorganic materials such as alumina ($Al_2O_3$) (about 1500 Vickers). For this reason, when wires for connecting to a large-scale integrated circuit (LSI) chip are connected to pads on the substrate by thermocompression bonding under high temperature and pressure, the organic materials are not only caved in or other-wise deformed to prevent adequate bonding but also the underlying wiring layers are disturbed to bring about faulty wiring. The prior art substrate described in the paper, in an attempt to solve the above problem, employs a leadless chip carrier (LCC) through which an LSI chip is connected to the substrate by soldering. However, mounting LSIs to the substrate through LCC's results in a decrease in attainable chip mounting density.

SUMMARY OF THE INVENTION

One object of the present invention is, therefore, to provide a multilayer wiring substrate which successfully eliminates the disadvantages described above.

According to one aspect of the invention, there is provided a multilayer wiring substrate for mounting a plurality of electronic circuit elements thereon, comprising: a plurality of wiring layers having wirings to be connected with the electronic circuit elements; a plurality of dielectric layers including an organic material for providing insulation between the wiring layers; a plurality of pads formed on the uppermost one of the dielectric layers and connected to wiring members by bonding; and at least one metal layer formed in at least one of the dielectric layers and adjacent to the pads for preventing a pressure applied during the bonding from acting on the wiring layers via the dielectric layers.

BRIEF DESCRIPTION OF THE DRAWINGS

Other features and advantages of the invention will become more apparent from the following detailed description when taken in conjunction with the accompanying drawings in which.

In the drawings, identical reference numerals represent identical structural elements.

DESCRIPTION OF THE PREFERRED EMBODIMENT

Figure 1:
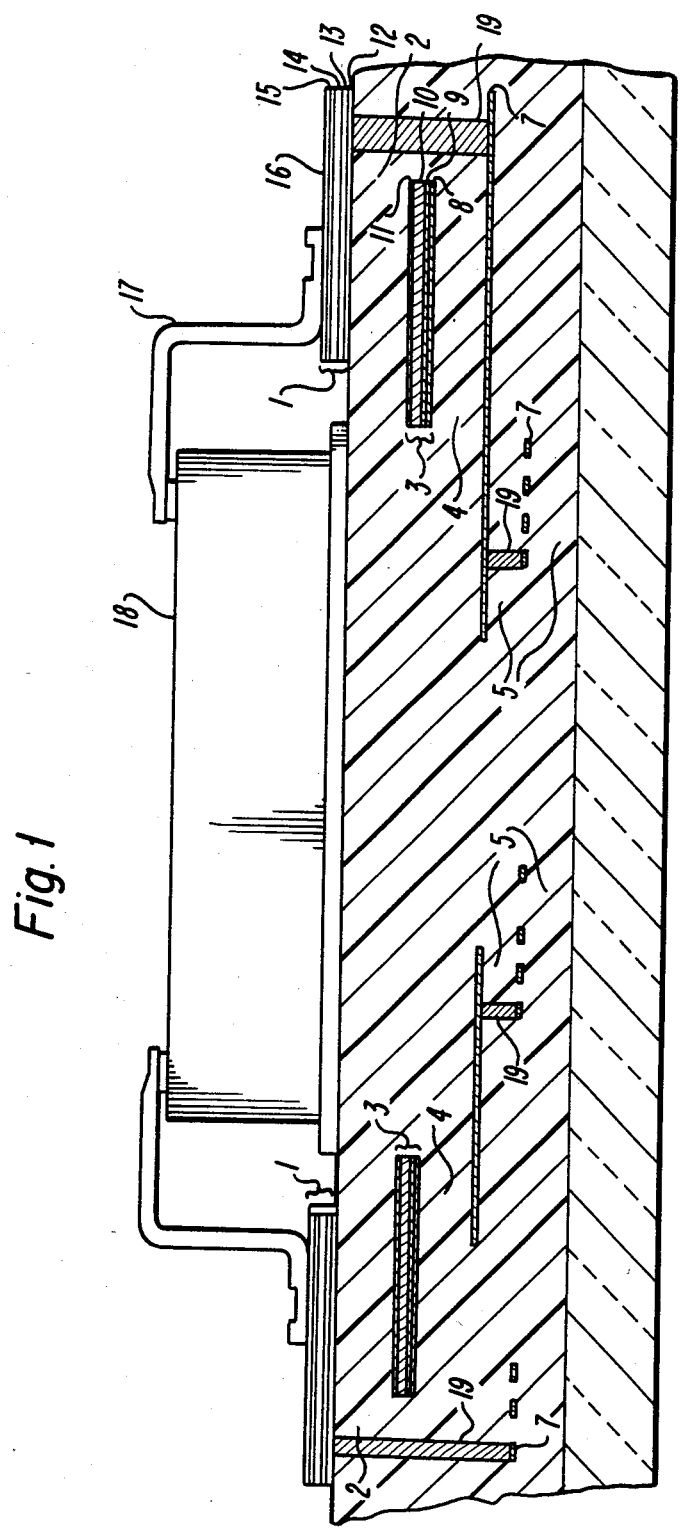
FIG. 1 is a partial cross sectional view of an embodiment of the present invention.
Figure 2:
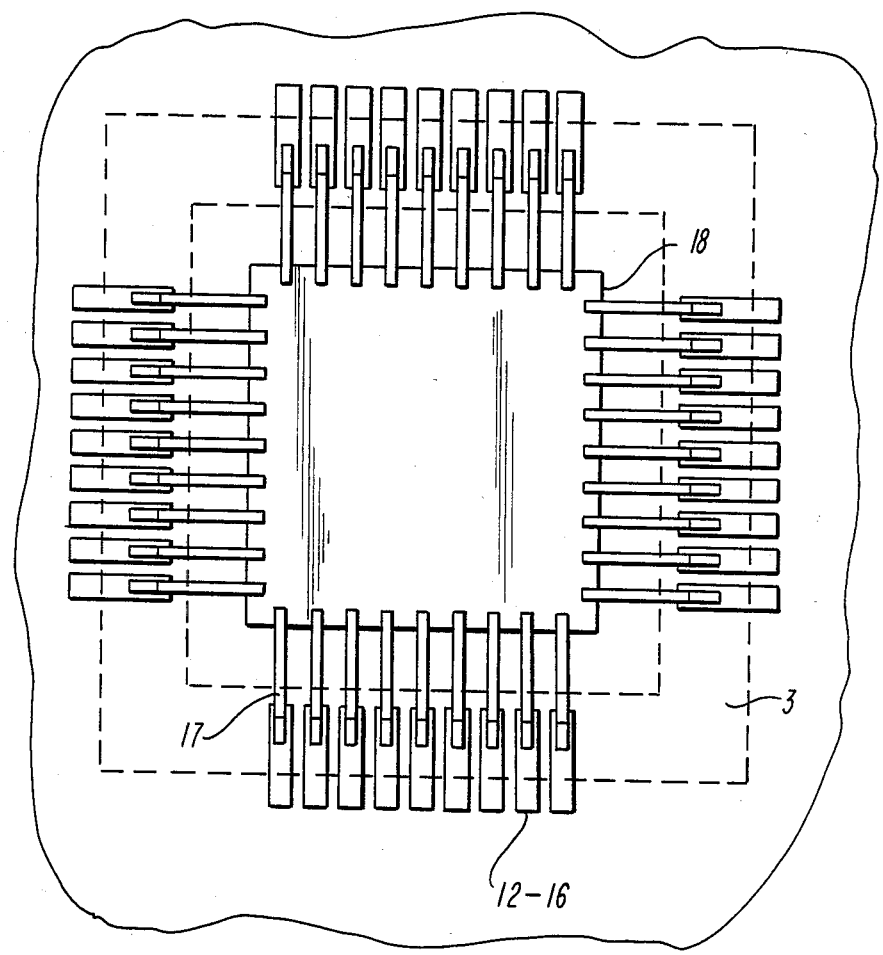
FIG. 2 is a plan view of the embodiment shown in FIG. 1.

Referring to FIGS. 1 and 2, an embodiment of the invention comprises a ceramic layer 6, a dielectric layer 5 on the ceramic layer 6 having wiring layers 7 disposed therein metal layers 3 formed on the wiring layers 7 through a dielectric layer 4, a plurality of bonding pads 1 formed above the metal layers 3 through a dielectric layer 2, a plurality of integrated circuit (IC) chips 18 (only one is shown in FIGS. 1 and 2) mounted on the dielectric layer 2, leads 17 each being made of gold electrically interconnecting the pads 1 and the IC chip 18, and inserts 19 providing electrical connection between at least one of the wiring layers 7 and the pads 1. As shown in FIG. 2, the metal layer 3 is discontinuous; i.e. it does not cover the entire face of dielectric layer 4. Each of the wiring layers 7 is provided with a wiring for transmission of a signal. The ceramic layer 6 is made of alumina or the like, while the dielectric layers 2, 4 and 5 are each made of polyimide or other organic materials. Each metal layer 3 is made up of a 500-1000 angstroms thick chromium (Cr) film 8 adapted to increase the adhesion strength of the metal layer 3 with the dielectric layer 4, a 1000 to 2000 angstroms thick palladium (Pd) film 9, an about 20 microns thick copper (Cu) film 10, and a 1 to 3 microns thick nickel (Ni) film 11, which are sequentially stacked one upon another. Each pad 1 overlying the metal layers 3 through the dielectric layer 2 is about 20 microns thick comprises a stratified structure essentially similar to the described structure of the metal layer 3 except for the provision of an about 3 microns thick gold (Au) plated film 16 on the top.

In accordance with the illustrative embodiment, the metal layers 3 intervening between the pads 1 and the wiring layers 7 provide reinforcement so as to protect the wiring layers 7 from being disturbed by the deformation of the dielectric layer 2 which is caused by the pressure due to thermocompression bonding of the leads 17 to the pads 1. As shown in FIG. 1, the metal layers 3 extend inwardly to a greater extent than do the pads 1. While the high adhesion strength between the metal layers 3 and the dielectric layer 4 in the illustrative embodiment is implemented by the chromium (Cr) film 8, it may alternatively be implemented by a titanium (Ti) film.

In summary, it will be seen that the present invention provides a multilayer wiring substrate which allows the pressure during thermocompression bonding to be increased to a degree desirable for bonding because the influence of the pressure does not reach wiring layers.

While this invention has thus for been described in conjunction with the preferred embodiment thereof, it will now readily be possible for those skilled in the art to put this invention into practice in various other manners.

What is claimed is:

1. A multilayer wiring substrate for mounting a plurality of electronic circuit elements thereon, comprising:

a plurality of wiring layers having wirings to be connected with said electronic circuit elements;

a plurality of dielectric layers including an organic material for providing insulation between said wiring layers;

a ceramic layer upon which said wiring layers and dielectric layers are provided;

a plurality of pads formed on the uppermost one of said dielectric layers and connected to wiring members by pressure bonding; and at least one discontinuous metal laminate including at least two metal layers formed in at least one of said dielectric layers and adjacent to said pads for preventing pressure applied during the bonding of the pads from disturbing said wiring layers.

2. A multilayer wiring substrate as claimed in claim 1, wherein said laminate includes a copper film and a nickel film.

3. A multilayer wiring substrate as claimed in claim 2, wherein said laminate further includes a chromium film to increase the adhesion strength of the metal layer to the at least one of said dielectric layers.

4. A multilayer wiring substrate as claimed in claim 2, wherein said laminate further includes a titanium film to increase the adhesion strength of the metal layer to the at least one of said dielectric layers.

5. A multilayer wiring substrate as claimed in claim 1, wherein said pad includes a copper film and a nickel film.

6. A multilayer wiring substrate as claimed in claim 1, wherein said pads, said wiring layers and said at least one laminate occupy areas that lie in respective planes that are substantially parallel to each other, wherein at least one wiring layer is disposed in an area that is offset from the area of said pads, and wherein said metal layer area is interposed between one of said pads and one of said wiring layers and extends in the direction of the offset to a greater extent than the one of said pads.

7. In a method of connecting wires from an integrated circuit chip to a bonding pad which includes bonding the wires to the pad by thermocompression and wherein the chip and pad are supported on an organic dielectric material having wiring layers disposed therein, the improvement comprising interposing a discontinuous metallic laminate of at least two metal layers between the bonding pad and wiring layers so that the wiring layers are not disturbed by deformation of the organic dielectric material during the thermocompression bonding.

* * * * *